(12) United States Patent
Tsai et al.

(10) Patent No.: US 10,153,273 B1
(45) Date of Patent: Dec. 11, 2018

(54) METAL-SEMICONDUCTOR HETERODIMENSION FIELD EFFECT TRANSISTORS (MESHFET) AND HIGH ELECTRON MOBILITY TRANSISTOR (HEMT) BASED DEVICE AND METHOD OF MAKING THE SAME

(71) Applicants: Roger S. Tsai, Torrance, CA (US); Weidong Liu, San Marino, CA (US); Yeong-Chang Chou, Irvine, CA (US)

(72) Inventors: Roger S. Tsai, Torrance, CA (US); Weidong Liu, San Marino, CA (US); Yeong-Chang Chou, Irvine, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 15/832,377

(22) Filed: Dec. 5, 2017

(51) Int. Cl.
*H01L 27/06* (2006.01)
*H01L 29/207* (2006.01)
(Continued)

(52) U.S. Cl.
CPC .... *H01L 27/0605* (2013.01); *H01L 21/28587* (2013.01); *H01L 21/32135* (2013.01);
(Continued)

(58) Field of Classification Search
CPC ............. H01L 27/0605; H01L 29/7786; H01L 29/66462; H01L 28/20; H01L 21/32135;
(Continued)

(56) References Cited

U.S. PATENT DOCUMENTS 5,038,187 A * 8/1991 Zhou .................... H01L 29/7785
257/14
5,252,843 A * 10/1993 Suzuki .............. H01L 21/28587
257/280

(Continued)

OTHER PUBLICATIONS

Lü, et al.: "Heterodimensional Field Effect Transistors for Ultra Low Power Applications"; 20th Annual Gallium Arsenide Integrated Circuit (GaAs IC) Symposium, 1998. Technical Digest 1998; Issue Date: Nov. 1-4, 1998, on pp. 187-190; Meeting Date: Nov. 1, 1998-Nov. 4, 1998, Location: Atlanta, GA, USA.

*Primary Examiner* — Syed Gheyas
(74) *Attorney, Agent, or Firm* — Tarolli, Sundheim, Covell & Tummino LLP

(57) ABSTRACT

A semiconductor device is provided that comprises a base structure, a first channel layer overlying the base structure, a second channel layer overlying the first channel layer, and first, second, and third ohmic contacts overlying the second channel layer. The semiconductor device further comprises a metal-semiconductor heterodimension field effect transistor that is formed between the first and second ohmic contacts, the metal-semiconductor heterodimension field effect transistor including a first gate formed through the first and second channel layers. The semiconductor device yet further comprises a high electron mobility transistor formed between the second and third ohmic contacts, the high electron mobility transistor including a second gate formed through the second channel layer without extending through the first channel layer.

20 Claims, 9 Drawing Sheets

(51) Int. Cl.
*H01L 29/423* (2006.01)
*H01L 29/778* (2006.01)
*H01L 29/80* (2006.01)
*H01L 49/02* (2006.01)
*H01L 21/8252* (2006.01)
*H01L 29/66* (2006.01)
*H01L 21/764* (2006.01)
*H01L 21/74* (2006.01)
*H01L 21/285* (2006.01)
*H01L 21/3213* (2006.01)
*H01L 23/528* (2006.01)
*H01L 23/482* (2006.01)
*H01L 23/66* (2006.01)
*H01L 29/205* (2006.01)

(52) U.S. Cl.
CPC .......... *H01L 21/746* (2013.01); *H01L 21/764* (2013.01); *H01L 21/8252* (2013.01); *H01L 23/4821* (2013.01); *H01L 23/5286* (2013.01); *H01L 23/66* (2013.01); *H01L 27/0629* (2013.01); *H01L 28/20* (2013.01); *H01L 28/60* (2013.01); *H01L 29/205* (2013.01); *H01L 29/207* (2013.01); *H01L 29/42316* (2013.01); *H01L 29/66462* (2013.01); *H01L 29/66916* (2013.01); *H01L 29/7786* (2013.01); *H01L 29/802* (2013.01); *H01L 2223/6683* (2013.01)

(58) Field of Classification Search
CPC ............... H01L 29/66916; H01L 23/66; H01L 21/8252
See application file for complete search history.

(56) References Cited

U.S. PATENT DOCUMENTS

| | | | | |
|---|---|---|---|---|
| 5,254,492 | A * | 10/1993 | Tserng | H01L 21/8252 148/DIG. 72 |
| 6,586,813 | B2 * | 7/2003 | Nagahara | H01L 21/28593 257/192 |
| 8,878,246 | B2 * | 11/2014 | Hwang | H01L 29/267 257/194 |
| 2002/0000573 | A1 * | 1/2002 | Higuchi | H01L 27/0605 257/197 |
| 2003/0027394 | A1 * | 2/2003 | Toyama | H01L 21/28593 438/289 |
| 2005/0110054 | A1 * | 5/2005 | Wohlmuth | H01L 21/82345 257/267 |
| 2013/0043485 | A1 * | 2/2013 | Ueno | H01L 29/42316 257/76 |
| 2013/0320402 | A1 * | 12/2013 | Tsai | H01L 29/66318 257/194 |
| 2014/0061725 | A1 * | 3/2014 | Park | H01L 29/778 257/194 |
| 2017/0141218 | A1 * | 5/2017 | Iucolano | H01L 29/7784 |

* cited by examiner

METAL-SEMICONDUCTOR HETERODIMENSION FIELD EFFECT TRANSISTORS (MESHFET) AND HIGH ELECTRON MOBILITY TRANSISTOR (HEMT) BASED DEVICE AND METHOD OF MAKING THE SAME

TECHNICAL FIELD

The present invention relates generally to electronics, and more particularly to a metal-semiconductor heterodimension field effect transistors (MESHFET) and high electron mobility transistor (HEMT) based device and method of making the same.

BACKGROUND

Certain heterostructure materials, such as Aluminum Gallium Arsenide (AlGaAs) and Indium Gallium Arsenide (InGaAs), create an energy well in the conduction band between the two dissimilar heterostructure materials. As a result, free carriers such as electrons or holes, may accumulate in the energy well forming a sheet of charge (i.e., a sheet of electrons). The resulting sheet of electrons that forms in the energy well are typically referred to as a Two-Dimensional Electron Gas ("2DEG") channel, while a sheet of hole carriers that forms is referred to as a Two-Dimensional Hole GaAs ("2DHG") channel. FETs that operate by generating and controlling the electrons in the 2D×G channel are conventionally referred to as high electron mobility transistors ("HEMTs").

A metal-semiconductor field-effect transistor (MESFET) utilizes a Schottky (metal-semiconductor) junction to deplete charge carriers in a semiconductor channel layer. MESFETs typically differ from a typical insulated gate FET or MOSFET in that there is no insulator under the gate over the active switching region, but typically share the feature of a gate contact that extends over the channel layer region. An aspect of this design is the gate metal contacts the 2D×G channel laterally and extends over the channel layer region, forming a Heterodimension metal-semiconductor junction. Generally, narrower the gate the lower the carrier transit time is within the semiconductor channel, which provides higher frequency RF current gain and RF transistor switching performance. MESFET current handling increases with carrier density within the semiconductor channel, but increased carrier density (ie, channel doping) decreases carrier mobility due to increased scattering. Increased channel doping/carrier density also requires that the gate metal contact be elongated in order to provide sufficient charge control. Therefore, in a typical MESFET a trade exists between current handling (current density), carrier transit time (ie high frequency) performance. As a result, most production MESFETs are either optimized for higher current density applications, such as low frequency RF power amplifier, RF switch, and high linearity mixers, or optimized for high frequency performance such as low-noise amplifier, or wideband RF switches. High frequency MESFET also uses a built up top layer of low resistance metal on the gate, often producing a mushroom-like profile in cross section. Building upon the basic structure of the HEMT, a metal-semiconductor heterodimension field effect transistor (MESHFET) has been developed that takes advantage of the heterostructure materials to increase electron mobility within the MESFET while also overcoming the trade off between carrier density and carrier transit time that exists for conventional MESFET. The lateral gate to 2D×G contact provides sufficient charge control even as the carrier density is increased with a gate length narrowed. MESHFETs have been used for microwave frequency communications and radar applications. The combination of MESHFET and HEMT in a monolithic integrated circuit provides optimal RF performance for multi-function designs that combine low-noise amplifiers, power amplifiers, low-loss and wideband RF switches, and high linearity mixers and amplifiers.

SUMMARY

In accordance with an example, a semiconductor device is provided that comprises a base structure, a first channel layer overlying the base structure, a second channel layer overlying the first channel layer, and first, second, and third ohmic contacts overlying the second channel layer. The semiconductor device further comprises a metal-semiconductor heterodimension field effect transistor that is formed between the first and second ohmic contacts, the metal-semiconductor heterodimension field effect transistor including a first gate formed through the first and second channel layers. The semiconductor device yet further comprises a high electron mobility transistor formed between the second and third ohmic contacts, the high electron mobility transistor including a second gate formed through the second channel layer without extending through the first channel layer.

In another example, a method of forming a semiconductor device is provided. The method comprises forming a first channel layer over a base structure, forming a second channel layer over the first channel layer, and forming first, second, and third ohmic contacts over the second channel layer. The method further comprises forming a metal-semiconductor heterodimension field effect transistor between the first and second ohmic contacts, forming a first gate for the metal-semiconductor heterodimension field effect transistor, the first gate including a trench extending through the first and second channel layers, and forming a high electron mobility transistor between the second and third ohmic contacts. The method yet further comprises forming a second gate for the high electron mobility transistor, the second gate for the high electron mobility transistor including another trench extending through the second channel layer without extending through the first channel layer.

In accordance with yet another example, a semiconductor device is provided that comprises a base structure, a first channel layer overlying the base structure, a second channel layer overlying the first channel layer, and first, second, and third ohmic contacts overlying the second channel layer. The semiconductor device further comprises a metal-semiconductor heterodimension field effect transistor formed between the first and second ohmic contacts, the metal-semiconductor heterodimension field effect transistor including a first gate formed through the first and second channel layers and a high electron mobility transistor formed between the second and third ohmic contacts, the high electron mobility transistor including a second gate formed through the second channel layer without extending through the first channel layer. The semiconductor device further comprises a ground plane underlying the base structure, the ground plane electrically coupled to the first ohmic contact via an interconnect metal and first and second isolation regions, a portion of the first ohmic contact overlying the first isolation region and a portion of the third ohmic contact overlying the second isolation region.

DETAILED DESCRIPTION

Figure 1A:
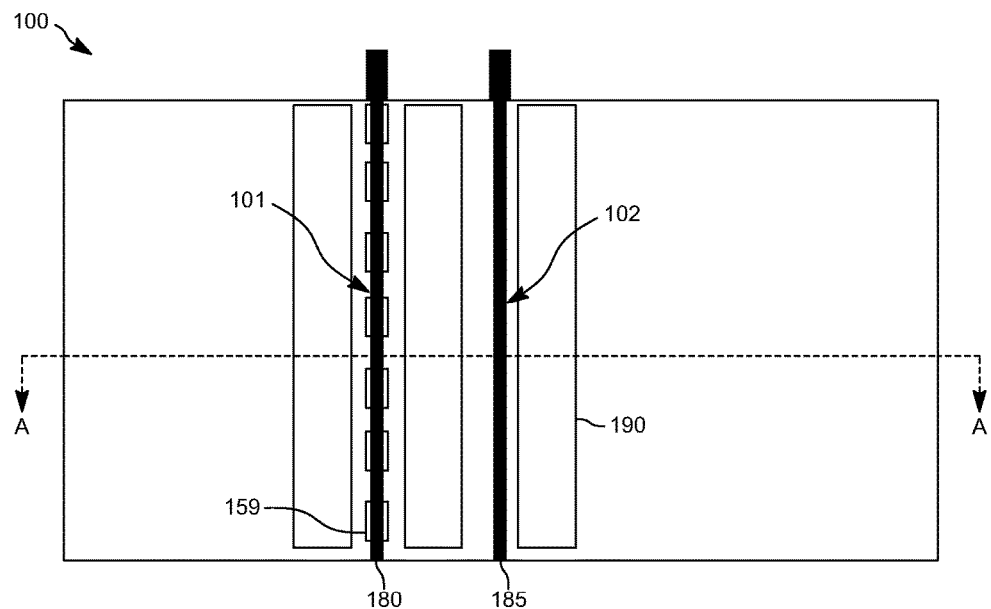
FIG. 1A illustrates a top plan view of an example semiconductor device.

The present disclosure is directed to a technique for simultaneously fabricating a semiconductor device, e.g., an integrated GaAs based circuit, that contains both a MESHFET and a HEMT on the base structure or wafer, thus increasing the versatility and performance of the semiconductor device. A MESHFET based device has been shown to have much better performance in linearity than a HEMT based device. This linearity is a result of the MESHFET having high linear current and voltage (e.g., Ids-Vgs) characteristics. However, the MESHFET based device typically has worse noise performance than the HEMT based device due to lower transconductance (Gm). For a Monolithic Microwave Integrated Circuit (MMIC) to have superior performance in both noise figure and linearity, a low noise transistor at input stage and a high linearity transistor at output stage are advantageous. For example, the MESHFET and HEMT based semiconductor device disclosed herein may take advantage of the superior low noise of the HEMT and high linearity of MESHFET. These two types of transistors may be integrated within a same semiconductor device, e.g., within a same MMIC, using a same material profile, to take advantage of characteristics associated with both of these types of transistors.

Example methods of integration involve simultaneously fabrication of an integrated GaAs based circuit containing both a MESHFET and a HEMT. A first gate for the MESHFET is formed, the first gate including a trench that extends through first and second channel layers that are formed over a base structure. The example method further forms a second gate for the HEMT, the second gate including another trench that extends through the second channel layer without extending through the first channel layer. Thus, a semiconductor device can be formed over the base structure, the semiconductor device formed to include both the MESHFET and the HEMT.

This description is intended to be read in connection with the accompanying drawings, which are to be considered part of the entire written description of this invention. The drawing figures are not necessarily to scale and certain features of the invention may be shown exaggerated in scale or in somewhat schematic form in the interest of clarity and conciseness. In the description, relative terms such as "front," "back," "up," "down," "top" and "bottom," as well as derivatives thereof, should be construed to refer to the orientation as then described or as shown in the drawing figure under discussion. These relative terms are for convenience of description and normally are not intended to require a particular orientation. Terms concerning attachments, coupling and the like, such as "connected" and "attached," refer to a relationship wherein structures are secured or attached to one another either directly or indirectly through intervening structures, as well as both movable or rigid attachments or relationships, unless expressly described otherwise.

Figure 1B:
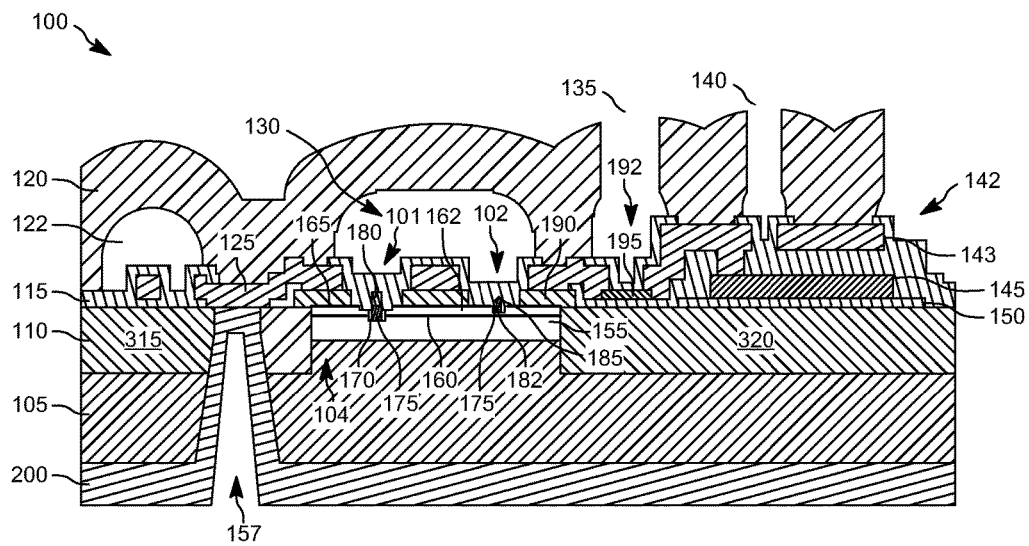
FIG. 1B illustrates a cross-sectional view of the semiconductor device illustrated in FIG. 1A, along the lines A-A.

FIG. 1A illustrates a top plan view of an example semiconductor device 100. FIG. 1B illustrates a cross-sectional view of the semiconductor device 100 illustrated in FIG. 1A, along the lines A-A. As illustrated, the various elements of the semiconductor device 100 illustrated in FIG. 1B extend the length of the semiconductor device 100, as illustrated in FIG. 1A.

The semiconductor device 100 is comprised of a MESHFET 101 and a HEMT 102 that are formed within a same base structure 104. The base structure 104 is formed overlying the wafer substrate 105, to the left of center of the semiconductor device 100. On either side of the base structure 104 are two isolation regions, a left isolation region 315 and a right isolation region 320. The left and right isolation regions 315 and 320 are deposited to form a height that is approximately even with a top of the base structure 104 and is approximately twice as thick as the base structure 104. The left isolation region 315 is approximately half in width than the right isolation region 320. Although the left isolation region 315 is illustrated as being smaller in width than the right isolation region 320, in another example the right isolation region 320 can be smaller than the left isolation region 315. In yet another example, the left and right isolation regions 315 and 320 can be approximately equal in width. An isolation material 110 is deposited in the left and right isolation regions 315 and 320. In an example, the isolation material 110 within at the left and right regions 315 and 320 is subject to ion bombardment.

The semiconductor device 100 includes three ohmic contacts 190, with the ohmic contacts 190 overlying the base structure 104. A center ohmic contact 190 is disposed approximately centrally along a width of the base structure 104. A left ohmic contact 190 overlays both the base structure 104 and the left isolation region 315. In an example, the left ohmic contact 190 is disposed with approximately a third of its width over the left isolation region 315 and its remainder being disposed over the base structure 104. In an example, the right ohmic contact 190 is disposed with approximately a third of its width over the right isolation region 320 and its remainder being disposed over the base structure 104.

Overlaid on the left and right isolation regions 315 and 320 is an insulator layer 115 (e.g., Si$_3$N$_4$). For the left isolation region 315, the insulator layer 115 spans from a left edge of the left isolation region 315 to a point where an interconnect metal 125 overlays the left isolation region 315. This interconnect metal 125 overlays the left isolation region 315 to the right of center of the left isolation region 315 approximately two-thirds a distance from the left edge of the left isolation region 315, coupling a ground plane 200 with the left ohmic contact 190. The insulator layer 115 also overlays the left isolation region 315 between this interconnect metal 125 and a left ohmic contact 190 that overlays both the left isolation region 315 and the base structure 104 where the two meet. An approximately square block of the interconnect metal 125 overlays this insulator layer 115 at a location approximately a third of the length of the left isolation region 315 from the left edge of the left isolation region 315. This approximately square block of the interconnect metal 125 is covered with a layer of the insulator layer 115. A long rectangular block of the interconnect metal 125 overlays an approximately central two-thirds portion of the center ohmic contact 190.

The MESHFET 101 is formed between the left ohmic contact 190 and the center ohmic contact 190. The MESHFET 101 includes a trench 170 formed into the base structure 104 from a top surface of the base structure 104 approximately centered between the left ohmic contact 190 and the center ohmic contact 190. This trench 170 creates a break in the channel 165 of the MESHFET 101 at a point where the MESHFET 101 is formed. The trench 170 has a depth approximately double a depth of a trench 175 of the HEMT 102, cutting through both the channel 160 for the MESHFET 101 and the HEMT 102, and the channel 165 for the MESHFET 101. A post 172 is deposited into the trench 170, forming the gate of the MESHFET 101. Another metallization process is performed to form a rectangular gate contact 180 that overlays the post 172. As illustrated in FIG. 1A, between the left ohmic contact 190 and the center ohmic contact 190 are a number of trenches 159, e.g., seven, that periodically sever a conductive path of the MESHFET 101 to limit an amount of current that is able to pass across the MESHFET 101.

The HEMT 102 is formed between the center ohmic contact 190 and the right ohmic contact 190. The HEMT 102 includes a trench 175 into the base structure 104 from a top surface of the base structure 104 approximately centered between the center ohmic contact 190 and the right ohmic contact 190. This trench 175 creates a break in the channel 165 of the MESHFET 101 at a point where the HEMT 102 is formed. The trench 175 has a depth approximately half a depth of the trench 170 of the MESHFET 101, cutting through the channel 165 for the MESHFET 101 and without cutting through the channel 160 for the MESHFET 101 and the HEMT 102. A post 182 is deposited into the trench 175, forming the gate of the HEMT 102. Another metallization process is performed to form a triangular gate contact 185 that overlays the gate of the HEMT 102, together the post 182 and the triangular gate contact 185 form a mushroom shaped metal structure.

The insulator layer 115 overlays elements between the left ohmic contact 190 and the right ohmic contact 190. The insulator layer 115 overlays a rightmost portion of the interconnect metal 125 that overlays the left isolation region 190 and that couples the ground plane 200 with the left ohmic contact 190. The insulator layer 115 also overlays the MESHFET 101, the center ohmic contact 190, and the HEMT 102.

As an example of a circuit element that may be created during formation of the MESHFET 101 and the HEMT 102, the semiconductor device 100 is further comprised of a resistor 192 (e.g., a thin film resistor) that is comprised of a thin film resistor material 195. The thin film resistor material 195 overlays the insulator layer 115 that overlays the right isolation region 320. This thin film resistor material 195 is coupled to the right ohmic contact 190 via the interconnect metal 125. The insulator layer 115 overlays the thin film resistor material 195.

As another example of a circuit element that may be created during formation of the MESHFET 101 and the HEMT 102, the semiconductor device 100 is further comprised of a capacitor 142 (e.g., metal-insulator-metal (MIM) capacitor). The capacitor 142 includes a bottom plate 145 that overlays the insulator layer 115 that overlays the right isolation region 320. The bottom plate 145 is disposed to the right of center of the right isolation region 320. The capacitor 142 further includes a top plate 143 formed from the interconnect metal, the top plate 143 overlaying the insulator layer 115 that overlays the bottom plate 145. The bottom plate 145 is coupled to the thin film resistor material 195 via the interconnect metal 125.

A ground plane 200 underlies an entire bottom surface of the semiconductor device 100 including into a via 157 that extends from the bottom of the semiconductor device 100 through the left isolation region 315. The ground plane 200 is coupled to the interconnect metal 125 that couples the left ohmic contacts 190 with the top metal 120.

A top metal 120 (e.g., gold) overlays the left isolation region 315 and the base structure 104. The top metal 120 is coupled to a left most edge of the insulator layer 115 that overlays the left isolation region 315, the interconnect metal 125 that couples the left ohmic contacts 190 with the top metal 120, and the interconnect metal 125 that couples the right ohmic contact 190 with the thin film resistor material 195. The top metal 120 is coupled to the interconnect metal 125 that couples the thin film resistor material 195 with the bottom plate 150 of the capacitor 142. Another portion of the top metal 120 is coupled to the top plate 143 of the capacitor 142. An air gap 122 is formed between the insulator layer 115 that covers the approximately square block of interconnect metal 125. Another air gap 122 is formed between the insulator layer 115 overlying the MESHFET 101 and the HEMT 102 and the interconnection metal 125 overlying the MESHFET 101 and the HEMT 102. Another air gap 122 is formed over the insulator layer 115 overlying the thin film resistor material 195, forming via 135, and another air gap 122 is formed between the portion of the top metal 120 that is coupled to the top plate 143 of the capacitor 142 and the top metal 120 that is coupled to the bottom plate 150 of the capacitor 142, forming via 135.

Figure 2:
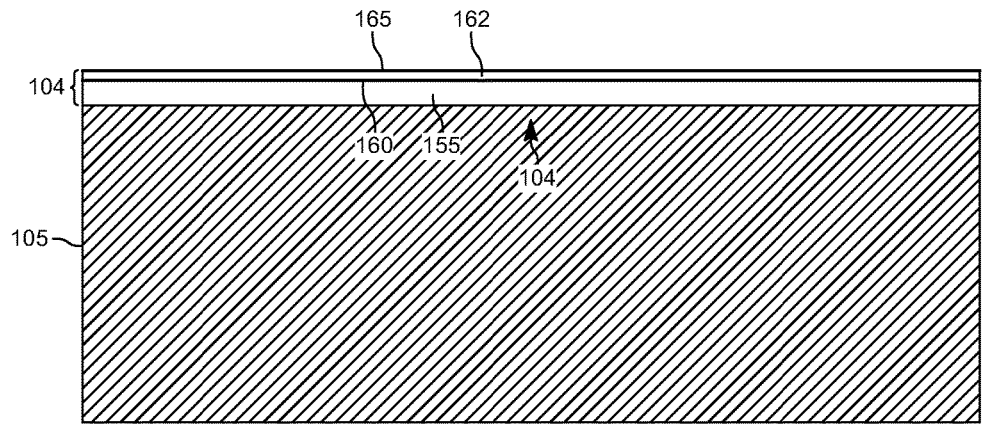
FIG. 2 illustrates a cross-sectional view of the semiconductor device in its early stages of fabrication, illustrating as a semiconductor structure.

Turning now to FIGS. 2-17, fabrication is discussed in connection with formation of the semiconductor device 100, as discussed in FIGS. 1A and 1B. FIG. 2 illustrates a cross-sectional view of the semiconductor device 100 in its early stages of fabrication, illustrated as a semiconductor structure. The base structure 104 is formed overlying the wafer structure 105. The base structure 104 can include a number of example layers that are grown atop one another, and atop the wafer structure 105 (e.g., crystalline silicon), via molecular beam epitaxy (MBE) growth. A bottom most layer of the base structure 104 can be comprised of a layer of GaAs, with a Si dopant concentration of approximately $<5.0\times10^{14}$ and having a thickness of approximately 3000 Å. Overlying this layer is another layer comprised of $Al_xGa_{1-x}As$, with a Si dopant concentration of approximately $<5.0\times10^{14}$ and having a thickness of approximately 300 Å. Overlying this layer is yet another layer comprised of $Al_{0.25}Ga_{0.75}As$, with a Si dopant concentration of approximately $<5.0\times10^{14}$ and having a thickness of approximately 300 Å. Overlying this layer is yet another layer comprised of $Al_{0.25}Ga_{0.75}As$, with a Si dopant concentration of approximately $4.5+0.5\times10^{18}$ and having a thickness of approximately 23 Å. Overlying this layer is yet another layer comprised of $Al_{0.25}Ga_{0.75}As$, with a Si dopant concentration of approximately $<5.0\times10^{14}$ and having a thickness of approximately 20 Å. Overlying this layer is yet another layer comprised of GaAs, with a Si dopant concentration of approximately $<5.0\times10^{14}$ and having a thickness of approximately 25 Å, with these six layers forming a region 155 of the base structure 104. Overlying this layer is yet another layer comprised of $In_{0.22}Ga_{0.78}As$, with a Si dopant concentration of approximately $<5.0\times10^{14}$ and having a thickness of approximately 140 Å, with this layer forming the channel 160 for the MESHFET 101 and the HEMT 102. Overlying this layer is yet another layer comprised of GaAs, with a Si dopant concentration of approximately $<5.0\times10^{14}$ and having a thickness of approximately 15 Å. Overlying this layer is yet another layer comprised of $Al_{0.25}Ga_{0.75}As$, with a Si dopant concentration of approximately $<5.0\times10^{14}$ and having a thickness of approximately 20 Å. Overlying this layer is yet another layer comprised of Si Plane, with a Si dopant concentration of approximately $4.7+0.5\times10^{12}$ ($cm^{-2}$). Overlying this layer is yet another layer comprised of $Al_{0.25}Ga_{0.75}As$, with a Si dopant concentration of approximately $<5.0\times10^{14}$ and having a thickness of approximately 500 Å, with these four layers forming a region 162 overlying the channel 160. Overlying this layer is yet another layer comprised of GaAs, with a Si dopant concentration of approximately $<3\times10^{18}$ ($cm^{-3}$) and having a thickness of approximately 500 Å, with this layer forming a topmost layer of the base structure 104 and the channel 165 for the MESHFET 101 and a cap for the HEMT 102. Thus, in this example the base structure 104 can include twelve layers. However, other base structures will be apparent to those skilled in the art.

Figure 3:
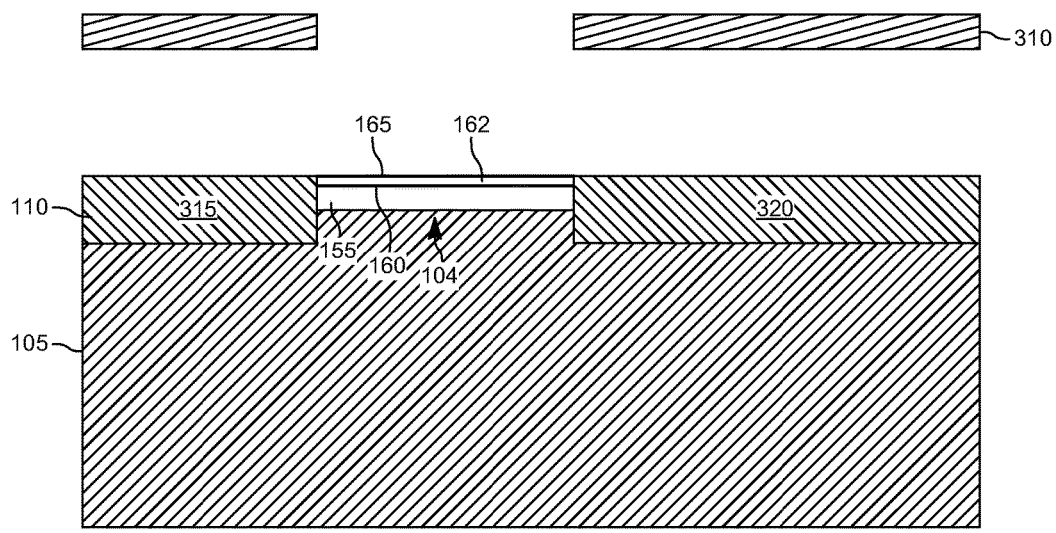
FIG. 3 illustrates another example semiconductor structure after the semiconductor structure illustrated in FIG. 2 is processed.

The semiconductor structure illustrated in FIG. 2 is further processed. A dark polarity negative photoresist process is performed in which a region of the semiconductor structure illustrated in FIG. 2 between the left and right isolation regions 315 and 320 is protected from a photoresist developer, in accordance with the mask 310. Portions of the base structure 104 in the left and right isolation regions 315 and 320 are removed in response to being subject to the photoresist developer. In this example, portions of the base structure 104 in the left and right isolation regions 315 and 320 are removed such that the left and right isolation regions 315 and 320 extend completely through the base structure 104 and into the wafer structure 105. Thereafter, the isolation material 110 is deposited in the left and right isolation regions 315 and 320. The isolation material 110 is deposited to form a height that is approximately even with a top of the base structure 104 and is approximately twice as thick as the base structure 104. FIG. 3 illustrates another example semiconductor structure after the semiconductor structure illustrated in FIG. 2 is processed in accordance with these example sequence of processes.

Nitride deposition is utilized to deposit the insulator layer 115 on the semiconductor structure illustrated in FIG. 2. Thereafter, the bottom plate 145 of the capacitor 142 is formed on the insulator layer 415. A capacitor plate material, e.g., one or more of titanium, platinum, and gold, is overlaid across an entire top surface of the semiconductor structure illustrated in FIG. 2. Then, such an overlay is subject to a light-polarity negative photoresist process in accordance with a mask 410 that corresponds in width to the bottom plate 145 of the capacitor 142. The bottom plate 145 of the capacitor 142 remains after the light-polarity negative photoresist process is completed.

Figure 4:
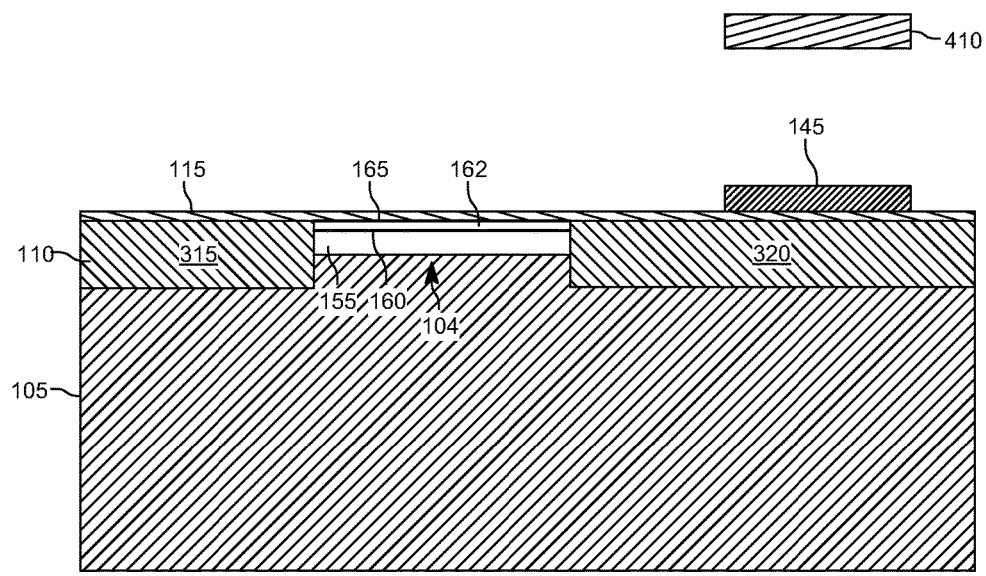
FIG. 4 illustrates yet another example semiconductor structure after the semiconductor structure illustrated in FIG. 3 is processed.
Figure 5:
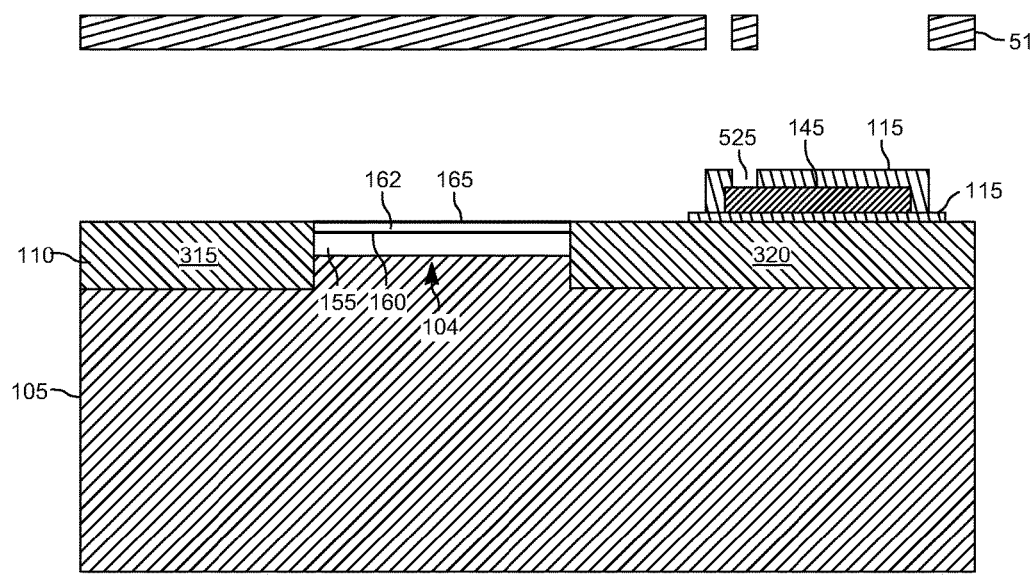
FIG. 5 illustrates another example semiconductor structure after the semiconductor structure illustrated in FIG. 4 is processed.

The semiconductor structure illustrated in FIG. 4 is further processed. First, deposition is utilized to overlay (not shown) the insulator layer 115 across the entire top surface of the semiconductor structure illustrated in FIG. 4. Thereafter, portions of this insulator layer 115 are removed. Regions of this insulator layer 115 are subject to a light-polarity negative photoresist process. This light-polarity negative photoresist process is performed in accordance with a mask 510. The insulator layer 115 overlaid on the bottom plate 145 of the capacitor 142 and a portion of the insulator layer 115 underneath the bottom plate 145 of the capacitor 142 remain after the light-polarity negative photoresist process is completed. The insulator layer 115 is a dielectric for the capacitor 142. A via 525 through this insulator layer 115 is formed overlying the bottom plate 145 of the capacitor 142 after the light-polarity negative photoresist process is completed. FIG. 5 illustrates yet another example semiconductor structure after the semiconductor structure illustrated in FIG. 4 is processed in accordance with these example sequence of processes.

Figure 6:
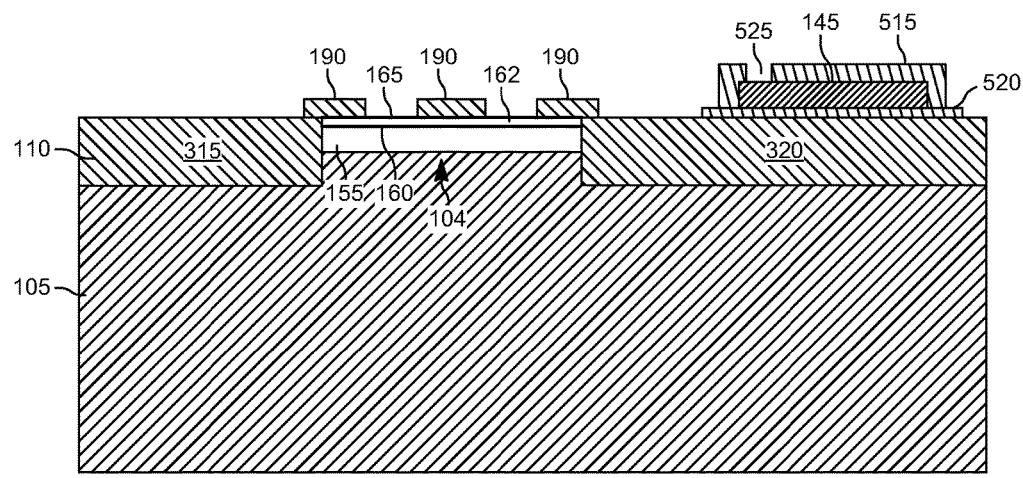
FIG. 6 illustrates even yet another example semiconductor structure after the semiconductor structure illustrated in FIG. 5 is processed.

The semiconductor structure illustrated in FIG. 5 is further processed. First, an overcoat of a mixture of nickel/germanium/gold or platinum/titanium/gold is overlaid across the entire top surface of the semiconductor structure illustrated in FIG. 5. Then, such an overlay is subject to a light-polarity negative photoresist process in accordance with a mask 610 that corresponds in width to the ohmic contacts 190 that are formed. The ohmic contacts 190 remain after the light-polarity negative photoresist process is completed. FIG. 6 illustrates another example semiconductor structure after the semiconductor structure illustrated in FIG. 5 is processed in accordance with these example sequence of processes.

Figure 7:
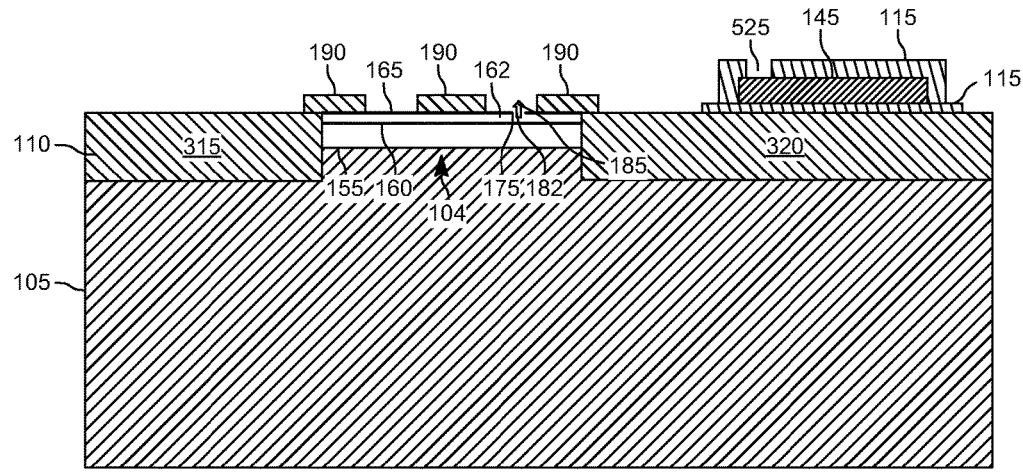
FIG. 7 illustrates another example semiconductor structure after the semiconductor structure illustrated in FIG. 6 is processed.

The semiconductor structure illustrated in FIG. 6 is further processed. The semiconductor structure illustrated in FIG. 7 is processed to form the gate of the HEMT 102. An area approximately equidistant between the center ohmic contact 190 and the right ohmic contact 190 is subject to electron beam lithography and chemical wet etching to form the trench 175 into the base structure 104. This trench 175 cuts through the channel 165 of the MESHFET 101 at a point where the HEMT 102 is formed. The trench 175 is formed at a depth approximately equal to half a distance between the exposed surface of the base structure 104 and the channel 160 for both the MESHFET 101 and the HEMT 102, without cutting through the channel 160 for both the MESHFET 101 and the HEMT 102. Thereafter, a metallization process is performed to deposit a metal (e.g., gold) within the trench 175, forming the post 182 which is the gate of the HEMT 102. Another metallization process is performed to form the triangular gate contact 185 of the gate of the HEMT 102. FIG. 7 illustrates even yet another example semiconductor structure after the semiconductor structure illustrated in FIG. 6 is processed in accordance with these example sequence of processes.

Figure 8:
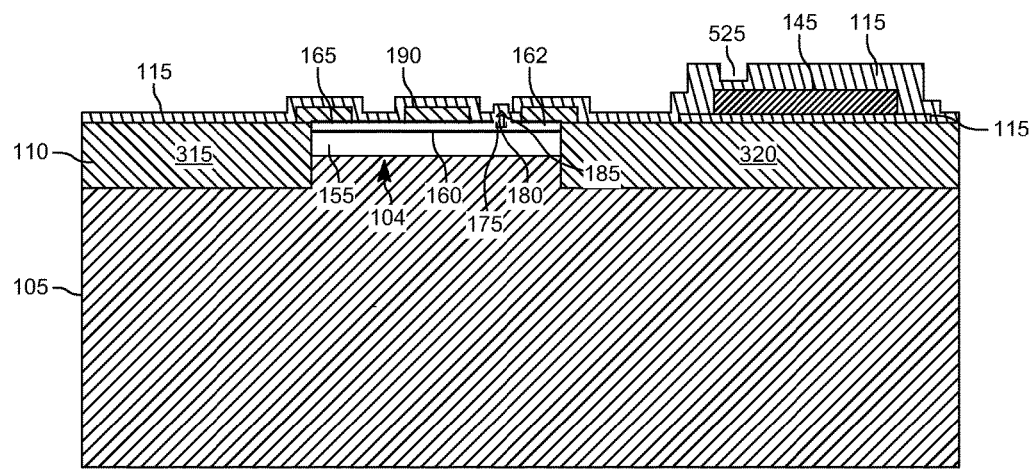
FIG. 8 illustrates yet another example semiconductor structure after the semiconductor structure illustrated in FIG. 7 is processed.

The semiconductor structure illustrated in FIG. 7 is further processed. An insulator layer 115 is deposited across the entire surface of the semiconductor structure illustrated in FIG. 7. In an example, plasma nitride deposition is used to deposit the insulator layer 115 across the entire surface of the semiconductor structure illustrated in FIG. 7. FIG. 8 illustrates another example semiconductor structure after the semiconductor structure illustrated in FIG. 7 is processed in accordance with these example sequence of processes. FIG. 8 illustrates a process by which the MESHFET 101 is formed within the base structure 104.

The semiconductor structure illustrated in FIG. 8 is further processed. Electron beam lithography and plasma dry etching (e.g., anisotropic dry etch) are utilized to form trench 170. An insulator layer 115 is deposited across the entire surface of the semiconductor structure illustrated in FIG. 8. In an example, plasma nitride deposition is used to deposit the insulator layer 115 across the entire surface of the semiconductor structure illustrated in FIG. 8.

Figure 9:
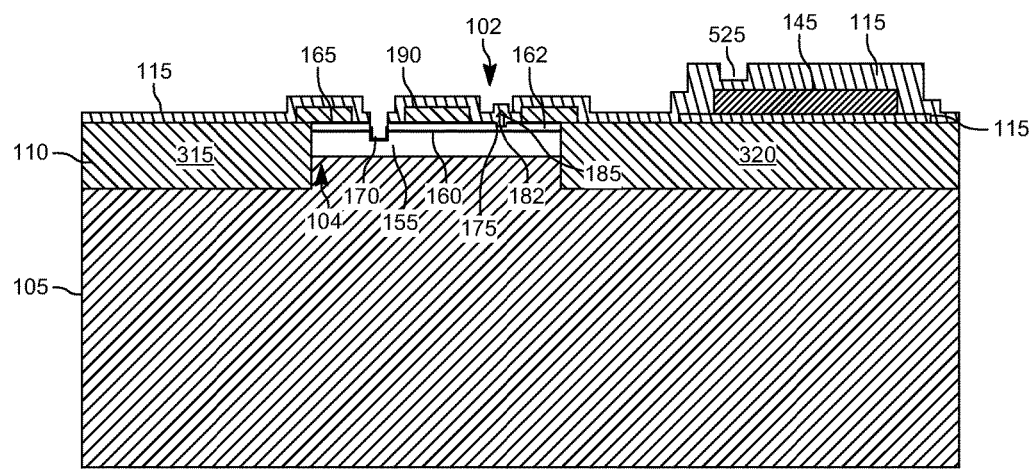
FIG. 9 illustrates another example semiconductor structure after the semiconductor structure illustrated in FIG. 8 is processed.

An area approximately equidistant between the center ohmic contact 190 and the left ohmic contact 190 is subject to electron beam lithography and chemical wet etching to form the trench 170 into the base structure 104. This trench 170 creates a break in the channel 165 of the MESHFET 101 at a point where the MESHFET 101 is formed. The trench 170 is formed at a depth approximately double a depth of the trench 175, cutting through both the channel 160 for the MESHFET 101 and the HEMT 102, and the channel 165 for the MESHFET 101. FIG. 9 illustrates yet another example semiconductor structure after the semiconductor structure illustrated in FIG. 8 is processed in accordance with these example sequence of processes. FIG. 9 illustrates another process by which the MESHFET 101 is formed within the base structure 104.

Figure 10:
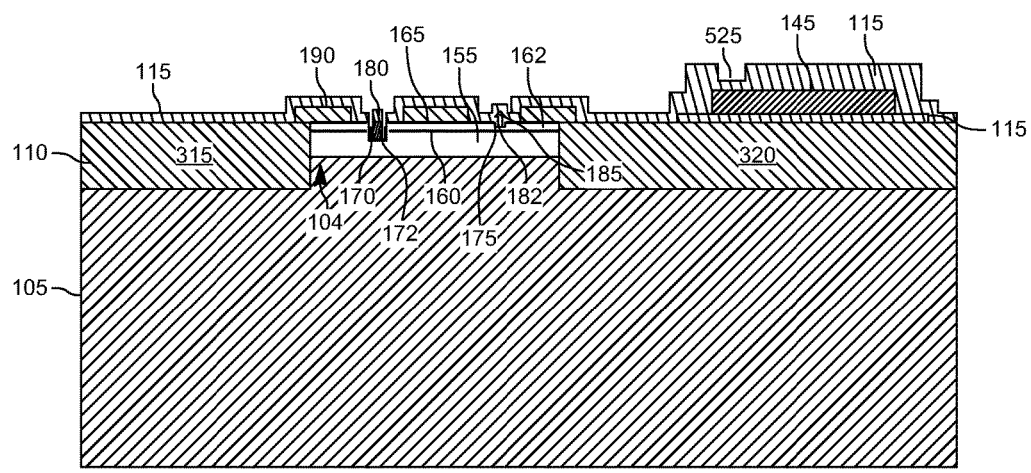
FIG. 10 illustrates yet another example semiconductor structure after the semiconductor structure illustrated in FIG. 9 is processed.

The semiconductor structure illustrated in FIG. 9 is further processed. A metallization process is performed to deposit a metal (e.g., gold) within the trench 170, forming the post 172 which is the gate of the MESHFET 101. Another metallization process is performed to form the rectangular gate contact 180 on the gate of the MESHFET 101. FIG. 10 illustrates another example semiconductor structure after the semiconductor structure illustrated in FIG. 9 is processed in accordance with these example sequence of processes. FIG. 10 illustrates another process by which the MESHFET 101 is formed within the base structure 104.

Figure 11:
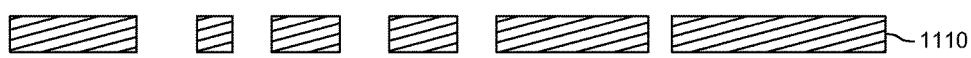
FIG. 11 illustrates another example semiconductor structure after the semiconductor structure illustrated in FIG. 10 is processed.
Figure 11:
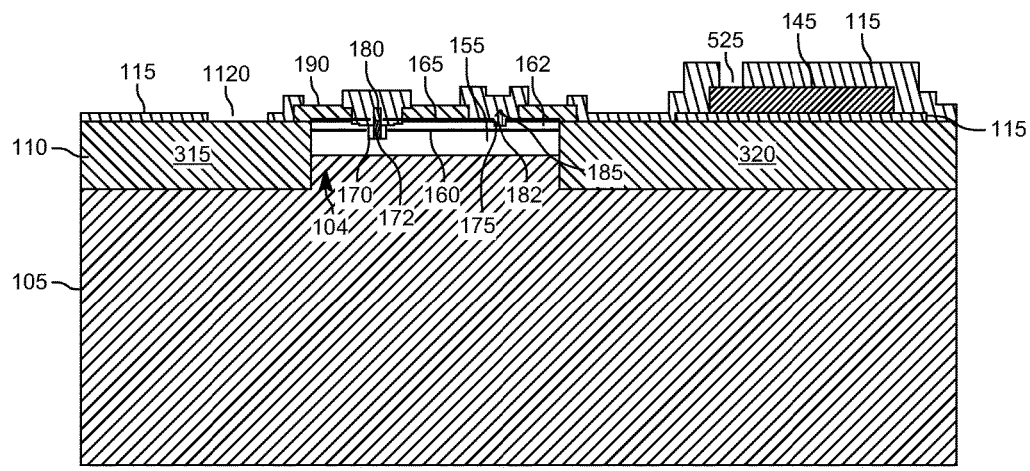

The semiconductor structure illustrated in FIG. 10 is further processed. An insulator layer 115 is first deposited across the entire surface of the semiconductor structure illustrated in FIG. 8. In an example, plasma nitride deposition is used to deposit the insulator layer 115 across the entire surface of the semiconductor structure illustrated in FIG. 8. Thereafter, a dark-polarity positive photoresist process is performed in which a region of this insulator layer 115 and previously deposited insulator layer 115 are protected from a photoresist developer, in accordance with the mask 1110. This process removes a central portion of the insulator layer 115 that overlays the left isolation region 315, a central portion of the insulator layer 115 that overlays the left ohmic contact 190, a central portion of the insulator layer 115 that overlays the center ohmic contact 190, a central portion of the insulator layer 115 that overlays the right ohmic contact 190, and forms a via 525 through the insulator layer 115 that overlays the bottom plate 145 of the capacitor 142. FIG. 11 illustrates another example semiconductor structure after the semiconductor structure illustrated in FIG. 10 is processed in accordance with these example sequence of processes. FIG. 11 illustrates yet another process by which the MESHFET 101 is formed within the base structure 104.

Figure 12:
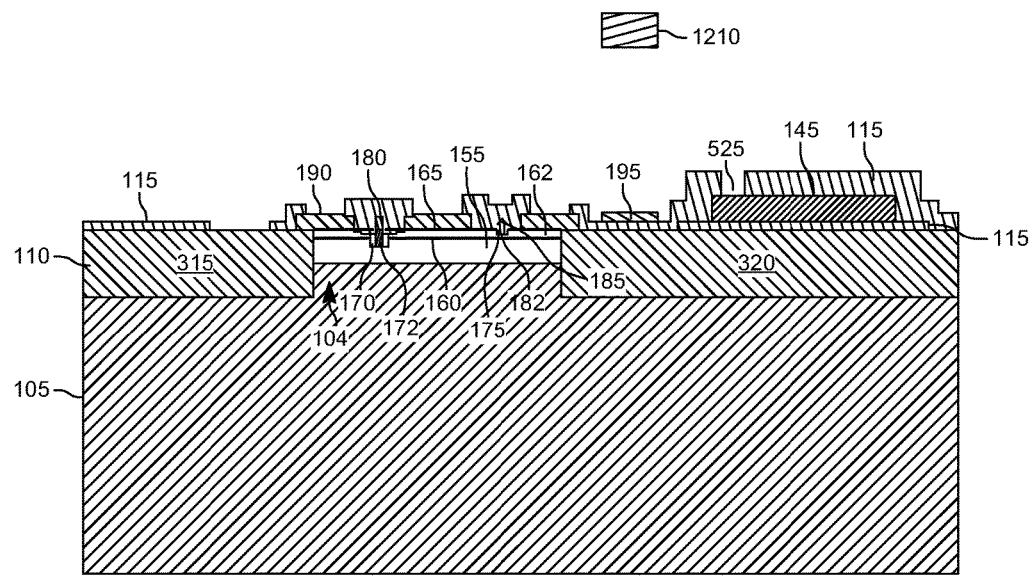
FIG. 12 illustrates even yet another example semiconductor structure after the semiconductor structure illustrated in FIG. 11 is processed.

The semiconductor structure illustrated in FIG. 11 is further processed. The thin film resistor material 195 is deposited across an entire top surface of the semiconductor structure illustrated in FIG. 11. A light polarity negative photoresist process is performed in which a region of the thin film resistor material 195 is protected from a photoresist developer, in accordance with the mask 1210, resulting in removal of the thin film resistor material 195 that does not correspond to the mask 1210. FIG. 12 illustrates even yet another example semiconductor structure after the semiconductor structure illustrated in FIG. 11 is processed in accordance with these example sequence of processes.

The semiconductor structure illustrated in FIG. 12 is further processed. A light polarity negative photoresist process is performed in which various regions of the semiconductor structure illustrated in FIG. 12 have the interconnect metal 125 (e.g., gold) overlaid, in accordance with mask 1310. The interconnect metal 125 is deposited across an entire top surface of the semiconductor structure illustrated in FIG. 12. Thereafter, a light polarity negative photoresist process is performed in which various portions of the interconnect metal 125 are removed and various portions of the interconnect metal 125 remain behind, in accordance with mask 1310.

Figure 13:
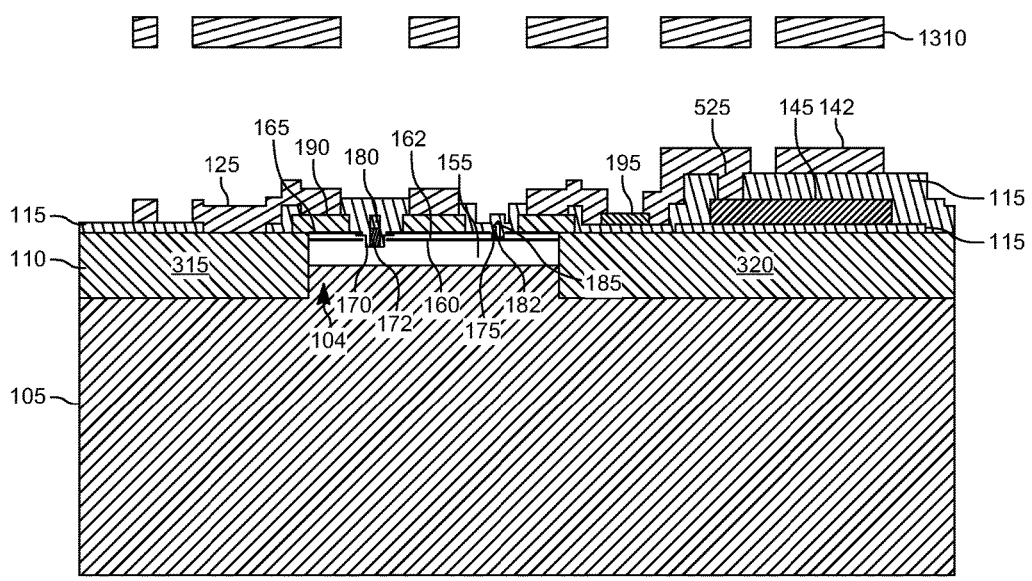
FIG. 13 illustrates another example semiconductor structure after the semiconductor structure illustrated in FIG. 12 is processed.

The approximately square block of the interconnect metal 125 remains left of center over the left isolation region 315, the interconnect metal 125 remains to couple the left ohmic contact 190 with the isolation material 110 in the left isolation region 315, the interconnect metal 125 remains overlaying the center ohmic contact 190, the interconnect metal 125 remains coupling the right ohmic contact 190 with the thin film resistor material 195, the interconnect metal 125 remains coupling the thin film resistor material 195 with the bottom plate 145 of the capacitor 142. Another portion of the interconnect metal 125 remains that overlays the insulator layer 115 at a region where the insulator layer 115 overlays the bottom plate 145 of the capacitor 142, forming the top plate 143 of the capacitor 142. A top portion of the thin film resistor material 195 remains uncovered, in accordance with the mask 1310. FIG. 13 illustrates yet another example semiconductor structure after the semiconductor structure illustrated in FIG. 12 is processed in accordance with these example sequence of processes.

Figure 14:
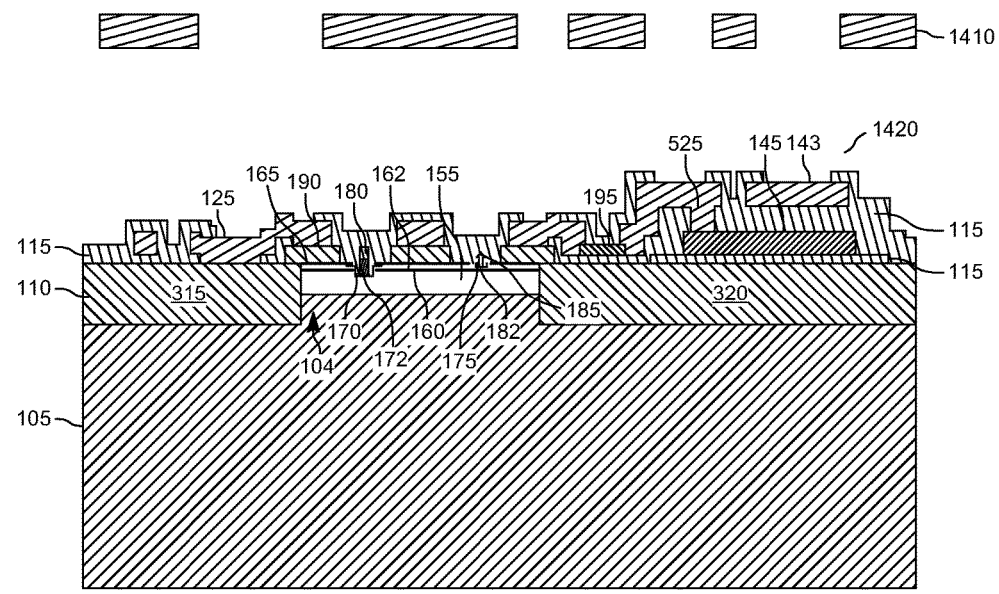
FIG. 14 illustrates another example semiconductor structure after the semiconductor structure illustrated in FIG. 13 is processed.

The semiconductor structure illustrated in FIG. 13 is further processed. First, deposition is utilized to overlay (not shown) the insulator layer 115 across the entire top surface of the semiconductor structure illustrated in FIG. 13. Thereafter, a light polarity negative photoresist process is performed in which vias 1420 are produced at various locations across the top surface of semiconductor structure illustrated in FIG. 13, in accordance with mask 1410. These vias 1420 cut through the insulator layer 115 that was just deposited on this semiconductor structure. The vias 1420 are formed over the interconnect metal 125 that couples the left ohmic contact 190 with the isolation material 110 in the left isolation region 315, the interconnect metal 125 coupling the right ohmic contact 190 with the thin film resistor material 195, the interconnect metal 125 coupling the thin film resistor material 195 with the bottom plate 145 of the capacitor 142, and the top plate 143 of the capacitor 142. FIG. 14 illustrates another example semiconductor structure after the semiconductor structure illustrated in FIG. 13 is processed in accordance with these example sequence of processes.

Figure 15:
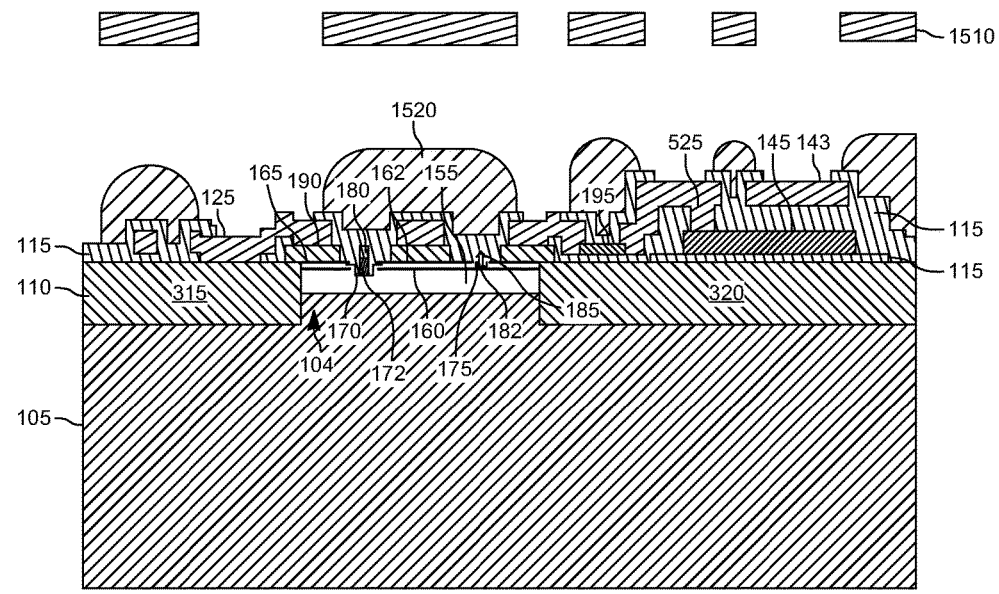
FIG. 15 illustrates yet another example semiconductor structure after the semiconductor structure illustrated in FIG. 14 is processed.

The semiconductor structure illustrated in FIG. 14 is further processed. A dark polarity positive photoresist process is performed to form airbridge posts 1520 that overlay the semiconductor structure illustrated in FIG. 14. The airbridge posts 1520 are overlaid at various locations on this semiconductor structure, in accordance with a mask 1510. In an example, the airbridge posts 1520 are photoresist. The airbridge posts 1520 are formed over the approximately square block of the interconnect metal 125 that remained left of center over the left isolation region 315, the center portion of the base structure 104 without covering the first level interconnect metal 125 contacting the left and right ohmic contacts 190, the thin film resistor material 195, a location between the vias 1420 formed over the interconnect metal 125 coupling the thin film resistor material 195 with the bottom plate 145 of the capacitor 142 and the top plate 143 of the capacitor 142, and a location to the right of the top plate 143 of the capacitor 142 without covering the top plate 143 of the capacitor 142. FIG. 15 illustrates even yet another example semiconductor structure after the semiconductor structure illustrated in FIG. 14 is processed in accordance with these example sequence of processes.

Figure 16:
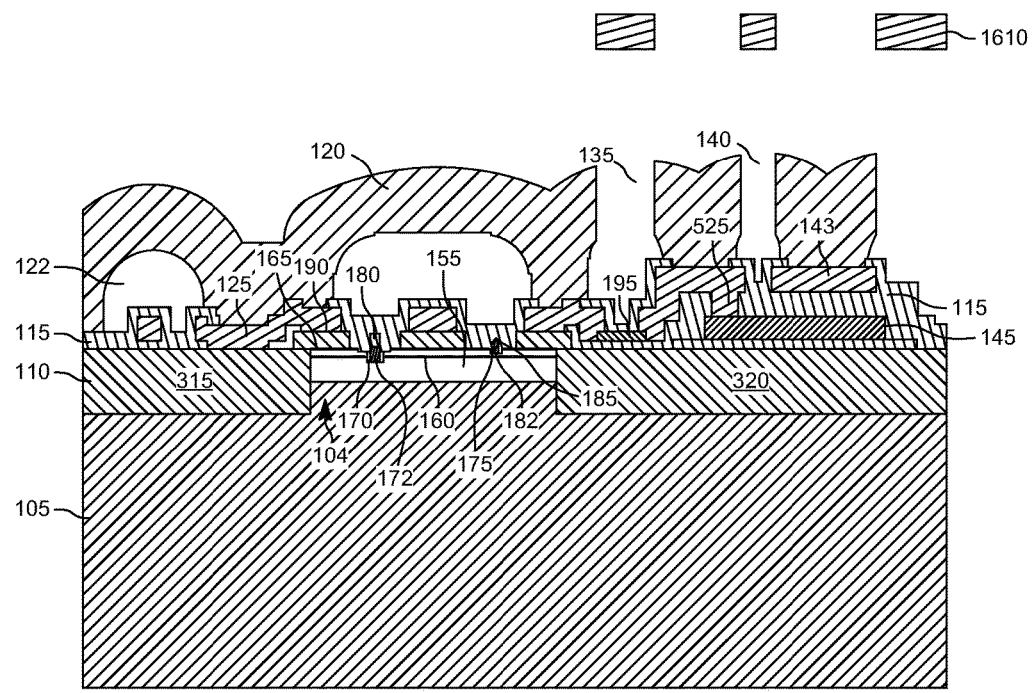
FIG. 16 illustrates another example semiconductor structure after the semiconductor structure illustrated in FIG. 15 is processed.

The semiconductor structure illustrated in FIG. 15 is further processed. First, the top metal 120 is overlaid across an entire top surface of the semiconductor structure illustrated in FIG. 15, including the airbridge posts 1520. Thereafter, a dark polarity positive photoresist process is performed, in accordance with the mask 1610. This dark polarity positive photoresist process forms vias in the top metal 120, in accordance with the mask 1610. Visas 1630 are formed over the thin film resistor material 195 and the airbridge post 1520 formed between the vias 1420 formed over the interconnect metal 125 coupling the thin film resistor material 195 with the bottom plate 145 of the capacitor 142, between the interconnect metal 125 coupling the thin film resistor material 195 with the bottom plate 145 of the capacitor 142 and the top plate 143 of the capacitor 142, and to the right of the top plate 143 of the capacitor 142. A portion of the top metal 120 couples the left and right ohmic contacts 190. Thereafter, the airbridge posts 1520 are dissolved away to leave the air gap 122 where the airbridge posts 1520 previously existed. FIG. 16 illustrates another example semiconductor structure after the semiconductor structure illustrated in FIG. 15 is processed in accordance with these example sequence of processes.

Figure 17:
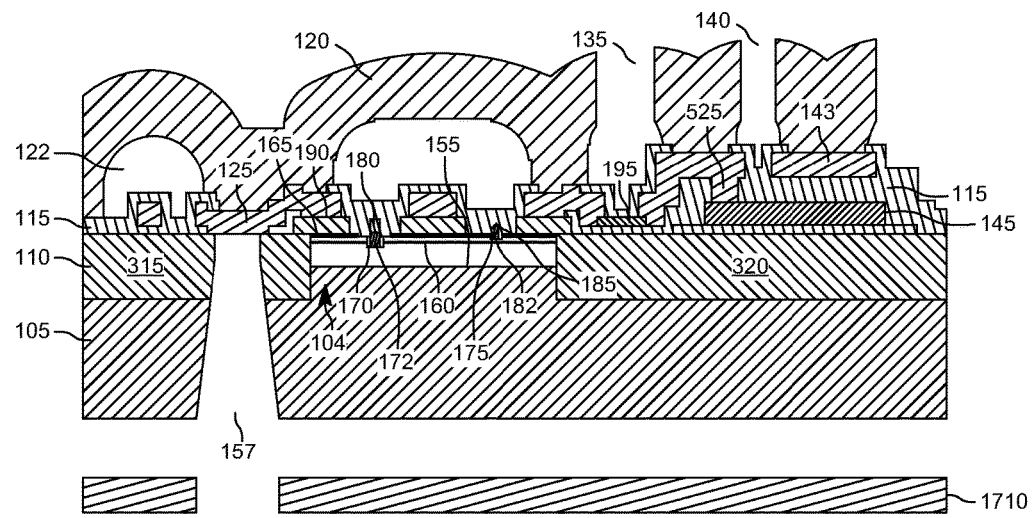
FIG. 17 illustrates even yet another example semiconductor structure after the semiconductor structure illustrated in FIG. 16 is processed.

The semiconductor structure illustrated in FIG. 16 is further processed. First, the bottom of the wafer substrate 105 is thinned to approximately half it's original thickness, as shown in FIGS. 2-16. For example, an etching process can be used to thin the wafer substrate 105. Thereafter, a dark polarity positive photoresist process is performed to form the via 157 on the underside of the wafer substrate 105, in accordance with the mask 1710. This via 157 extends from the underside of the wafer substrate 105, through the left isolation region 315, to the interconnect metal 125 that couples the left ohmic contacts 190 with the top metal 120. In an example, the walls of the via 157 slant such that the opening on the underside of the wafer substrate 105 are greater than on an opposite end of the via 157. Thereafter, an entire bottom surface of the semiconductor structure illustrated in FIG. 16 is metal plated (e.g., gold plated) to form another interconnect metal, the ground plane 200 that is coupled to the interconnect metal 125 that couples the left ohmic contacts 190 with the top metal 120. FIG. 17 illustrates another example semiconductor structure after the semiconductor structure illustrated in FIG. 16 is processed in accordance with these example sequence of processes.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A semiconductor device, comprising:
 a base structure;
 a first channel layer overlying the base structure;
 a second channel layer overlying the first channel layer;
 first, second, and third ohmic contacts overlying the second channel layer;
 a metal-semiconductor heterodimension field effect transistor formed between the first and second ohmic contacts, the metal-semiconductor heterodimension field effect transistor including a first gate formed through the first and second channel layers; and
 a high electron mobility transistor formed between the second and third ohmic contacts, the high electron mobility transistor including a second gate formed through the second channel layer without extending through the first channel layer.

2. The semiconductor device of claim 1, wherein the base structure is comprised of at least one of gallium arsenide, aluminum gallium arsenide, and indium gallium arsenide.

3. The semiconductor device of claim 1, wherein the first channel layer is comprised of $In_{0.22}Ga_{0.78}As$ with a silicon dopant concentration of approximately $<5.0\times10^{14}$ and a thickness of approximately 140 Å.

4. The semiconductor device of claim 1, wherein the second channel layers is comprised of gallium arsenide with a silicon dopant concentration of approximately $<3\times10^{18}$ ($cm^{-3}$) and a thickness of approximately 500 Å.

5. The semiconductor device of claim 1, wherein the second gate of the high electron mobility transistor is wider than the first gate of the metal-semiconductor heterodimension field effect transistor.

6. The semiconductor device of claim 1, further comprising a top metal overlying the high electron mobility transistor and the metal-semiconductor heterodimension field effect transistor, with an air gap separating the high electron mobility transistor and the metal-semiconductor heterodimension field effect transistor from the top metal.

7. The semiconductor device of claim 1, further comprising a ground plane underlying the base structure, the ground plane electrically coupled to the first ohmic contact via an interconnect metal.

8. The semiconductor device of claim 1, further comprising a mushroom shaped gate contact coupled to the second gate of the high electron mobility transistor and a post shaped gate contact coupled to the first gate of the metal-semiconductor heterodimension field effect transistor.

9. The semiconductor device of claim 1, further comprising first and second isolation regions, a portion of the first ohmic contact overlying the first isolation region and a portion of the third ohmic contact overlying the second isolation region.

10. The semiconductor device of claim 1, wherein the first gate of the metal-semiconductor heterodimension field effect transistor is formed via anisotropic dry etching and the second gate of the high electron mobility transistor is formed via electron beam lithography.

11. The semiconductor device of claim 10, further comprising a metal-insulator-metal capacitor formed overlying the isolation region adjacent the high electron mobility transistor, the metal-insulator-metal capacitor coupled to the high electron mobility transistor via an interconnect metal.

12. A method of forming a semiconductor device, comprising:
   forming a first channel layer over a base structure;
   forming a second channel layer over the first channel layer;
   forming first, second, and third ohmic contacts over the second channel layer;
   forming a metal-semiconductor heterodimension field effect transistor between the first and second ohmic contacts;
   forming a first gate for the metal-semiconductor heterodimension field effect transistor, the first gate including a trench extending through the first and second channel layers;
   forming a high electron mobility transistor between the second and third ohmic contacts;
   forming a second gate for the high electron mobility transistor, the second gate including another trench extending through the second channel layer without extending through the first channel layer.

13. The method of forming a semiconductor device of claim 12, wherein the first channel layers is formed with a thickness of approximately 140 Å and is comprised of $In_{0.22}Ga_{0.78}As$ with a silicon dopant concentration of approximately $<5.0\times10^{14}$.

14. The method of forming a semiconductor device of claim 12, wherein the second channel layer is formed with a thickness of approximately 500 Å and is comprised of gallium arsenide with a silicon dopant concentration of approximately $<3\times10^{18}$ $(cm^{-3})$.

15. The method of forming a semiconductor device of claim 12, further comprising forming the second gate of the high electron mobility transistor wider than the first gate of the metal-semiconductor heterodimension field effect transistor.

16. The method of forming a semiconductor device of claim 14, further comprising wherein the first channel layer is comprised of $In_{0.22}Ga_{0.78}As$ with a silicon dopant concentration of approximately $<5.0\times10^{14}$ and a thickness of approximately 140 Å and the second channel layers is comprised of gallium arsenide with a silicon dopant concentration of approximately $<3\times10^{18}$ $(cm^{-3})$ and a thickness of approximately 500 Å.

17. The method of forming a semiconductor device of claim 12, further comprising forming a top metal overlying the high electron mobility transistor and the metal-semiconductor heterodimension field effect transistor, with an air gap separating the high electron mobility transistor and the metal-semiconductor heterodimension field effect transistor from the top metal.

18. A semiconductor device, comprising:
   a base structure;
   a first channel layer overlying the base structure;
   a second channel layer overlying the first channel layer;
   first, second, and third ohmic contacts overlying the second channel layer;
   a metal-semiconductor heterodimension field effect transistor formed between the first and second ohmic contacts, the metal-semiconductor heterodimension field effect transistor including a first gate formed through the first and second channel layers; and
   a high electron mobility transistor formed between the second and third ohmic contacts, the high electron mobility transistor including a second gate formed through the second channel layer without extending through the first channel layer;
   a ground plane underlying the base structure, the ground plane electrically coupled to the first ohmic contact via an interconnect metal; and
   first and second isolation regions, a portion of the first ohmic contact overlying the first isolation region and a portion of the third ohmic contact overlying the second isolation region.

19. The semiconductor device of claim 18, further comprising a metal-insulator-metal capacitor formed overlying the isolation region adjacent the high electron mobility transistor, the metal-insulator-metal capacitor coupled to the high electron mobility transistor.

20. The semiconductor device of claim 18, wherein the first gate of the metal-semiconductor heterodimension field effect transistor is formed via anisotropic dry etching and the second gate of the high electron mobility transistor is formed via electron beam lithography.

* * * * *